(12) United States Patent
Kinoshita et al.

(10) Patent No.: US 7,601,985 B2
(45) Date of Patent: Oct. 13, 2009

(54) SEMICONDUCTOR LIGHT-EMITTING DEVICE

(75) Inventors: Yoshitaka Kinoshita, Kagoshima (JP); Hidenori Kamei, Fukuoka (JP)

(73) Assignee: Panasonic Corporation, Osaka (JP)

( * ) Notice: Subject to any disclaimer, the term of this patent is extended or adjusted under 35 U.S.C. 154(b) by 144 days.

(21) Appl. No.: 11/521,491

(22) Filed: Sep. 15, 2006

(65) Prior Publication Data

US 2007/0057282 A1 Mar. 15, 2007

(30) Foreign Application Priority Data

Sep. 15, 2005 (JP) ............................. 2005-267852

(51) Int. Cl.
*H01L 31/0256* (2006.01)

(52) U.S. Cl. .................. 257/76; 257/79; 257/94; 257/96; 257/97; 257/190; 257/196; 257/E31.019; 257/E31.022; 257/E27.12; 257/E33.023; 257/E33.024; 257/E33.025; 257/E33.026; 257/E33.027; 257/E33.028; 257/E33.029; 257/E33.03; 257/E33.032; 257/E33.033; 257/E33.034; 257/E33.044; 257/E33.048; 257/E33.049; 257/101; 257/183; 257/E33.031; 438/46; 438/47; 372/43.01; 372/45.011; 372/50.1

(58) Field of Classification Search .................. 257/76, 257/79, 94, 96, 97, 101, 183, 190, 196, E27.12, 257/E31.019, E31.022, E33.023–E33.034, 257/E33.044, E33.048, E33.049, E33.031; 372/43.01, 45.011, 50.1; 438/46, 47
See application file for complete search history.

(56) References Cited

U.S. PATENT DOCUMENTS

| | | | |
|---|---|---|---|
| 5,173,751 A * | 12/1992 | Ota et al. ..................... 257/76 |
| 5,656,832 A | 8/1997 | Ohba et al. | |
| 6,194,742 B1 * | 2/2001 | Kern et al. ............. 372/45.011 |
| 6,337,493 B1 * | 1/2002 | Tanizawa et al. .............. 257/79 |
| 6,441,393 B2 * | 8/2002 | Goetz et al. .................... 257/13 |
| 6,555,403 B1 * | 4/2003 | Domen et al. ................. 438/22 |
| 2001/0038656 A1 * | 11/2001 | Takeuchi et al. .............. 372/45 |
| 2002/0008245 A1 * | 1/2002 | Goetz et al. .................... 257/87 |
| 2002/0058349 A1 * | 5/2002 | Khan et al. .................... 438/22 |
| 2002/0094002 A1 * | 7/2002 | Amano et al. ................. 372/45 |
| 2002/0141469 A1 * | 10/2002 | Yamasaki et al. ............. 372/46 |
| 2003/0132440 A1 * | 7/2003 | Oku et al. ...................... 257/79 |
| 2004/0041156 A1 | 3/2004 | Tsuda et al. | |
| 2004/0213309 A9 * | 10/2004 | Amano et al. ................. 372/45 |
| 2005/0141577 A1 * | 6/2005 | Ueta et al. ..................... 372/43 |
| 2006/0011135 A1 * | 1/2006 | Dmitriev et al. ............ 118/718 |
| 2006/0043394 A1 * | 3/2006 | Wu et al. ....................... 257/94 |
| 2007/0138505 A1 * | 6/2007 | Preble et al. ................ 257/190 |

(Continued)

FOREIGN PATENT DOCUMENTS

JP 8-70139 A 3/1996

(Continued)

*Primary Examiner*—Wael Fahmy
*Assistant Examiner*—Hrayr A Sayadian
(74) *Attorney, Agent, or Firm*—McDermott Will & Emery LLP

(57) ABSTRACT

A semiconductor light-emitting device includes: a substrate; a first conductivity type layer formed on the substrate and including a plurality of group III-V nitride semiconductor layers of a first conductivity type; an active layer formed on the first conductivity type layer; and a second conductivity type layer formed on the active layer and including a group III-V nitride semiconductor layer of a second conductivity type. The first conductivity type layer includes an intermediate layer made of $Al_xGa_{1-x-y}In_yN$ (wherein $0.001 \leq x < 0.1$, $0 < y < 1$ and $x+y < 1$).

7 Claims, 2 Drawing Sheets

U.S. PATENT DOCUMENTS

2008/0116477 A1 * 5/2008 Komada .................... 257/103

FOREIGN PATENT DOCUMENTS

| JP | 11-214798 A | 8/1999 |
| JP | 2001-60719 A | 3/2001 |
| JP | 2003-31552 A | 1/2003 |
| JP | 2005-268581 A | 9/2005 |
| WO | WO 2005/091385 A1 | 9/2005 |

* cited by examiner

SEMICONDUCTOR LIGHT-EMITTING DEVICE

CROSS-REFERENCE TO RELATED APPLICATIONS

The disclosure of Japanese Patent Application No. 2005-267852 filed on Sep. 15, 2005 including specification, drawings and claims is incorporated herein by reference in its entirety.

BACKGROUND OF THE INVENTION (1) Field of the Invention

The present invention relates to semiconductor light-emitting devices, and more particularly relates to gallium nitride based semiconductor light-emitting devices, such as light-emitting diodes and laser diodes.

(2) Description of Related Art

In recent years, group III-V nitride semiconductors represented by a general formula, $Al_xGa_{1-x-y}In_yN$ (wherein $0 \leq x \leq 1$, $0 \leq y \leq 1$ and $x+y \leq 1$), have been frequently used as semiconductor materials for light-emitting devices operating in the range from visible to ultraviolet wavelengths and electronic devices operating at high powers and high temperatures.

In general, light-emitting devices using group III-V nitride semiconductors are each formed of an n-type semiconductor layer and a p-type semiconductor layer both formed on a substrate of sapphire and an active layer interposed between the n-type semiconductor layer and the p-type semiconductor layer (see, for example, Japanese Unexamined Patent Publication No. 8-70139).

In a case where a group III-V nitride semiconductor layer is formed on a substrate of sapphire, the respective lattices of the sapphire and the group III-V nitride semiconductor cannot be completely matched. The reason for this is that sapphire has a different lattice constant and thermal expansion coefficient from a group III-V nitride semiconductor. In view of the above, the number of defects in a semiconductor layer is increased, resulting in a reduction in the activation ratio of dopants, in particular, in a p-type cladding layer made of p-type aluminum gallium nitride (AlGaN) and a p-type contact layer made of p-type gallium nitride (GaN). This leads to an increase in the electrical resistances of these layers, resulting in an increase in the operating voltage of a semiconductor light-emitting device.

A method has also been considered in which the lattice mismatch between the substrate and the n-type semiconductor layer is reduced by allowing the n-type semiconductor layer to include an intermediate layer of gallium indium nitride (GaInN) or AlGaN. However, this method does not sufficiently achieve a reduction in the operating voltage of a semiconductor light-emitting device.

SUMMARY OF THE INVENTION

The present invention is made to solve the known problems, and its object is to achieve a low-operating-voltage semiconductor light-emitting device including a group III-V nitride semiconductor formed on a substrate having a different lattice constant from the group III-V nitride semiconductor.

In order to achieve the above-mentioned object, the present invention is configured such that a semiconductor light-emitting device includes an intermediate layer made of a group III-V nitride semiconductor containing Al and In.

To be specific, a semiconductor light-emitting device of the present invention includes: a substrate; a first conductivity type layer formed on the substrate and including a plurality of group III-V nitride semiconductor layers of a first conductivity type; an active layer formed on the first conductivity type layer; and a second conductivity type layer formed on the active layer and including a group III-V nitride semiconductor layer of a second conductivity type, the first conductivity type layer including an intermediate layer made of $Al_xGa_{1-x-y}In_yN$ (wherein $0.001 \leq x < 0.1$, $0 < y < 1$ and $x+y < 1$).

The semiconductor light-emitting device of the present invention reduces the lattice mismatch between the intermediate layer made of $Al_xGa_{1-x-y}In_yN$ (wherein $0.001 \leq x < 0.1$, $0 < y < 1$ and $x+y < 1$) and another layer. This enhances the crystallinity of the intermediate layer. Enhancement of the crystallinity of the intermediate layer enhances the activation ratio of carriers in a semiconductor layer of a second conductivity type formed on the intermediate layer, resulting in a reduction in the electrical resistance of the semiconductor light-emitting device. This can reduce the operating voltage of the semiconductor light-emitting device.

In the semiconductor light-emitting device of the present invention, a part of the first conductivity type layer, the active layer and the second conductivity type layer preferably form a mesa, and the part of the first conductivity type layer forming part of the mesa preferably includes the intermediate layer.

In the semiconductor light-emitting device of the present invention, a part of the first conductivity type layer, the active layer and the second conductivity layer preferably form a mesa, and the part of the first conductivity type layer forming part of the mesa is preferably a part of the first conductivity type layer except at least the intermediate layer.

In the semiconductor light-emitting device of the present invention, the intermediate layer is preferably the closest one of the plurality of group III-V nitride semiconductor layers of the first conductivity type to the substrate. With this structure, the intermediate layer can be used also as a buffer layer.

In the semiconductor light-emitting device of the present invention, the substrate is preferably made of a hexagonal material, and the principal surface of the substrate is preferably oriented along the (0001) plane.

In the semiconductor light-emitting device of the present invention, the substrate is preferably made of sapphire.

DETAILED DESCRIPTION OF THE INVENTION

Embodiment

Figure 1:
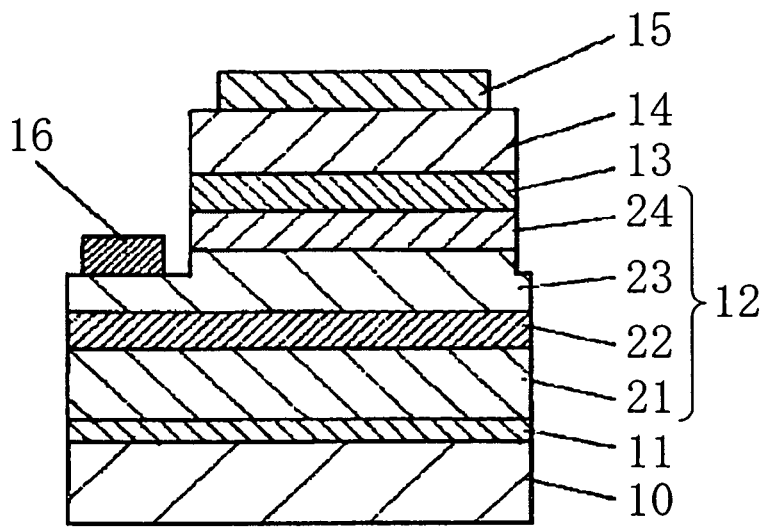
FIG. 1 is a cross-sectional view illustrating a semiconductor light-emitting device according to an embodiment of the present invention.

An embodiment of the present invention will be described with reference to the drawings. FIG. 1 illustrates a cross-sectional structure of a semiconductor light-emitting device according to this embodiment. As illustrated in cross section in FIG. 1, in the semiconductor light-emitting device of this embodiment, a low-temperature buffer layer 11 of GaN is formed on a substrate 10 of sapphire, and an n-type semiconductor layer 12, an active layer 13 and a p-type semiconductor layer 14 are sequentially formed on the buffer layer 11.

The n-type semiconductor layer 12 includes a first n-type layer 21 made of GaN doped with Si, an intermediate layer 22 made of $Al_xGa_{1-x-y}In_yN$ (wherein $0.001 \leq x < 0.1$, $0 < y < 1$ and $x+y<1$) doped with Si, a second n-type layer 23 made of GaN doped with Si, and a cladding layer 24 made of undoped AlGaN. The first n-type layer 21, the intermediate layer 22, the second n-type layer 23, and the cladding layer 24 are formed in bottom-to-top order. The active layer 13 has a multi-quantum well structure in which barrier layers of GaN and well layers of InGaN are alternately stacked. The p-type semiconductor layer 14 is made of AlGaN doped with Mg.

A p-side electrode 15 is formed on the p-type semiconductor layer 14. The following layers are partially removed to expose part of the second n-type layer 23: the p-type semiconductor layer 14; the active layer 13; and a combination of the cladding layer 24 and the second n-type layer 23 forming part of the n-type semiconductor layer 12. An n-side electrode 16 is formed on the exposed part of the second n-type layer 23. Table 1 illustrates an exemplary specific structure of the semiconductor light-emitting device according to this embodiment, e.g., the composition of each of semiconductor layers.

strate 10 has a diameter of 2 inch (5.08 cm) and a thickness of 400 μm. Semiconductor light-emitting devices according to this embodiment are formed by dividing the 2-inch-diameter substrate 10. The two-dimensional size of each semiconductor light-emitting device is 300 μm×300 μm. Furthermore, the semiconductor light-emitting device has a peak emission wavelength of 455 nm and represents a so-called light-emitting diode (hereinafter, referred to as LED).

A description will be given below of results obtained by considering the correlation between the composition and thickness of the intermediate layer 22 made of $Al_xGa_{1-x-y}In_yN$ and the operating characteristics of the semiconductor light-emitting device of this embodiment.

Figure 2:
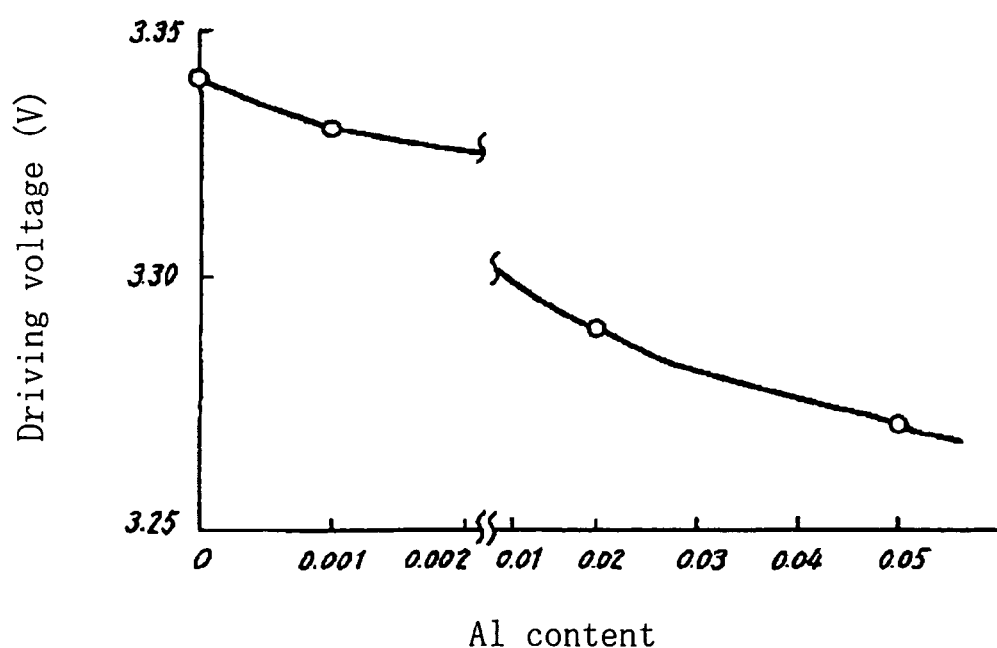
FIG. 2 is a graph illustrating the correlation between the Al content of an intermediate layer of the semiconductor light-emitting device according to the embodiment of the present invention and the operating voltage of the semiconductor light-emitting device.

FIG. 2 illustrates the relationship between the Al content x of an intermediate layer 22 and the operating voltage of the light-emitting device when the intermediate layer 22 has a thickness of 150 nm. The In content of the intermediate layer 22 is 0.02. Furthermore, the operating voltage means the voltage applied to a semiconductor light-emitting device to allow a current of 20 mA to flow therethrough. As illustrated in FIG. 2, it has been found that when the Al content of the intermediate layer 22 is 0.001 or more, the operating voltage can become smaller than that when the Al content of a known intermediate layer 22 is 0, i.e., when the known intermediate layer 22 is made of $Ga_{0.98}In_{0.02}N$. Furthermore, it has been recognized that the operating voltage tends to decrease with an increase in the Al content x of the intermediate layer 22.

TABLE 1

| | Al content | In content | thickness | | dopant | Impurity diffusion $(cm^{-3})$ | Other |
|---|---|---|---|---|---|---|---|
| Sapphire substrate 10 | 0 | 0 | 400 | μm | — | | |
| Low-temperature buffer layer 11 | 0 | 0 | 20 | nm | — | | |
| n-type layer 21 | 0 | 0 | 5 | μm | Si | $5 \times 10^{18}$ | |
| Intermediate layer 22 | x | y | 10~500 | nm | Si | $5 \times 10^{18}$ | |
| Second n-type layer 23 | 0 | 0 | 500 | nm | Si | $5 \times 10^{18}$ | |
| Cladding layer 24 | 0.05 | 0 | 20 | nm | Undoped | — | |
| Active layer 13 Barrier layers | 0 | 0 | 16 | nm | Undoped | — | Four well layers and three barrier layers are alternately formed. |
| Active layer 13 Well layers | 0 | 0.06 | 2 | nm | Undoped | — | |
| p-type layer 14 | 0.05 | 0 | 100 | nm | Mg | $1 \times 10^{20}$ | |

The p-side electrode 15 represents a 1-μm-thick Au-based reflector. The n-side electrode 16 represents a 1-μm-thick Au-based contact electrode. A part of the second n-type layer 23 on which the n-side electrode 16 is formed has a thickness of 500 nm.

The principal surface of the substrate 10 used in this embodiment is oriented along the (0001) plane, and the sub- The reason why the results illustrated in FIG. 2 are produced is considered as follows. The lattice mismatch between the intermediate layer 22 containing Al and In, i.e., the intermediate layer 22 made of $Al_xGa_{1-x-y}In_yN$ (wherein $0.001 \leq x < 0.1$, $0 < y < 1$ and $x+y<1$), and a first n-type layer 21 of GaN becomes smaller than that between a known intermediate layer of GaInN that is not doped with Al and a first n-type layer 21. This enhances the crystallinity of the inter mediate layer 22. This enhancement of the crystallinity of the intermediate layer 22 leads to enhancement of the crystallinities of a second n-type layer 23, a cladding layer 24, an active layer 13, and a p-type semiconductor layer 14 sequentially formed on the intermediate layer 22. The enhancement of the crystallinity of the p-type semiconductor layer 14 reduces the number of crystal defects acting as carrier traps. This enhances the activation ratio of Mg serving as a dopant, resulting in an increase in the carrier concentration of the p-type semiconductor layer 14 and thus a reduction in the resistivity thereof. This is considered to lead to a decrease in the operating voltage of the semiconductor light-emitting device. Furthermore, the increase in the carrier concentration of the p-type semiconductor layer 14 reduces the contact resistance between the p-type semiconductor layer 14 and the p-side electrode 15. This is also considered as one of the reasons why the operating voltage decreases.

Modification 1 of Embodiment

Figure 3:
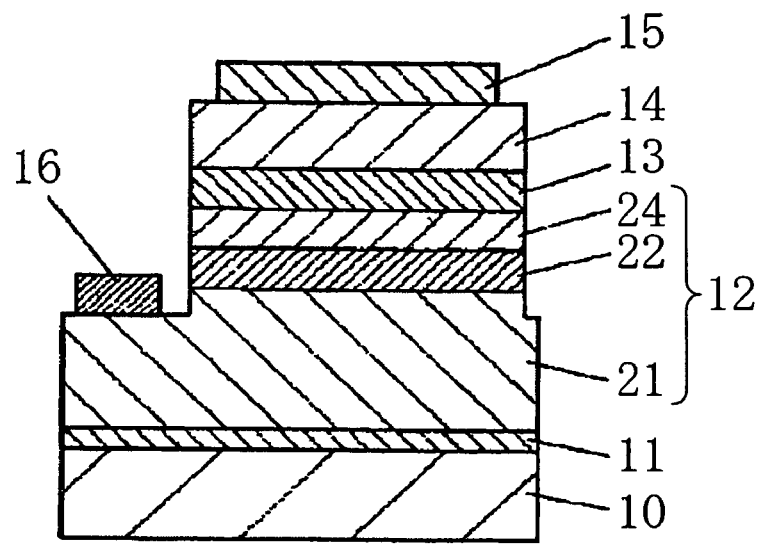
FIG. 3 is a cross-sectional view illustrating a semiconductor light-emitting device according to a first modification of the embodiment of the present invention.

A first modification of the embodiment of the present invention will be described hereinafter with reference to the drawings. FIG. 3 illustrates a cross-sectional structure of a semiconductor light-emitting device according to this modification. In FIG. 3, the same components as those in FIG. 1 are denoted by the same reference numerals, and thus description thereof will be omitted.

Unlike the semiconductor light-emitting device of the embodiment of the present invention, a semiconductor light-emitting device of this modification is formed without a second n-type layer 23 and configured such that an n-side electrode 16 is formed on a first n-type layer 21. Table 2 illustrates an exemplary specific structure of the semiconductor light-emitting device according to the first modification, such as the composition of each of semiconductor layers.

Like the semiconductor light-emitting device of the embodiment, an intermediate layer containing Al and In, i.e., an intermediate layer 22 made of $Al_xGa_{1-x-y}In_yN$ (wherein $0.001 \leq x < 0.1$, $0 < y < 1$ and $x+y < 1$) is used for the semiconductor light-emitting device of the first modification. This reduces the lattice mismatch between the intermediate layer 22 and a first n-type layer 21 made of GaN. This enhances the crystallinity of the intermediate layer 22 and increases the carrier concentration of a p-type semiconductor layer 14. In view of the above, it can be expected that the operating characteristics of a semiconductor light-emitting device will be improved.

Modification 2 of Embodiment

Figure 4:
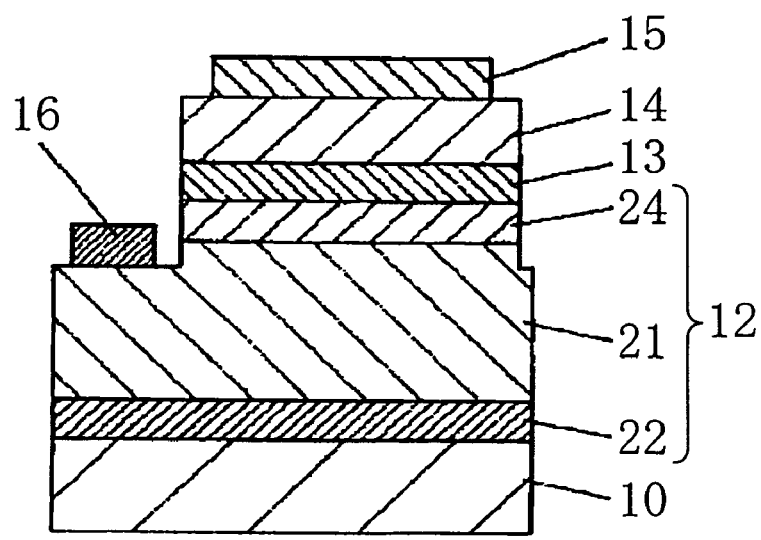
FIG. 4 is a cross-sectional view illustrating a semiconductor light-emitting device according to a second modification of the embodiment of the present invention.

A second modification of the embodiment of the present invention will be described hereinafter with reference to the drawings. FIG. 4 illustrates a cross-sectional structure of a semiconductor light-emitting device according to this modification. In FIG. 4, the same components as those in FIG. 1 are denoted by the same reference numerals, and thus description thereof will be omitted.

Unlike the semiconductor light-emitting device of the first modification, the semiconductor light-emitting device of this modification is configured such that an intermediate layer 22 is formed between a first n-type layer 21 and a substrate 10 and also serves as a buffer layer 11. Table 3 illustrates an exemplary specific structure of the semiconductor light-emitting device according to the second modification, such as the composition of each of semiconductor layers.

TABLE 2

| | | Al content | In content | thickness | dopant | Impurity diffusion ($cm^{-3}$) | Other |
|---|---|---|---|---|---|---|---|
| Sapphire substrate 10 | | 0 | 0 | 400 μm | — | | |
| Low-temperature buffer layer 11 | | 0 | 0 | 20 nm | — | | |
| n-type layer 21 | | 0 | 0 | 5 μm | Si | $5 \times 10^{18}$ | |
| Intermediate layer 22 | | X | y | 10~500 nm | Si | $5 \times 10^{18}$ | |
| Cladding layer 24 | | 0.05 | 0 | 20 nm | Undoped | — | |
| Active layer 13 | Barrier layer | 0 | 0 | 16 nm | Undoped | — | Four well layers and three barrier layers are alternately formed. |
| | Well layer | 0 | 0.06 | 2 nm | Undoped | — | |
| p-type layer 14 | | 0.05 | 0 | 100 nm | Mg | $1 \times 10^{20}$ | |

TABLE 2

| | Al content | In content | thickness | dopant | Impurity diffusion (cm$^{-3}$) | Other |
|---|---|---|---|---|---|---|
| Sapphire substrate 10 | 0 | 0 | 400 μm | — | | |
| Intermediate layer 22 | x | y | 10~500 nm | Si | $5 \times 10^{18}$ | |
| n-type layer 21 | 0 | 0 | 500 nm | Si | $5 \times 10^{18}$ | |
| Cladding layer 24 | 0.05 | 0 | 20 nm | Undoped | — | |
| Active layer 13 Barrier layer | 0 | 0 | 16 nm | Undoped | — | Four well layers and three barrier layers are alternately formed. |
| Well layer | 0 | 0.06 | 2 nm | Undoped | — | |
| p-type layer 14 | 0.05 | 0 | 100 nm | Mg | $1 \times 10^{20}$ | |

Like the semiconductor light-emitting device of the embodiment, an intermediate layer containing Al and In, i.e., an intermediate layer 22 made of Al$_x$Ga$_{1-x-y}$In$_y$N (wherein 0.001≦x<0.1, 0<y<1 and x+y<1) is used for the semiconductor light-emitting device of the second modification. This reduces the lattice mismatch between the first n-type layer 21 and the intermediate layer 22. This enhances the crystallinity of the first n-type layer 21 and increases the carrier concentration of a p-type semiconductor layer 14. In view of the above, it can be expected that the operating characteristics of a semiconductor light-emitting device will be improved.

In the embodiment and modifications, a sapphire substrate is used as a substrate 10. However, also in a case where a substrate which is made of SiC, GaN, MgAlO$_2$, or any other material and on which a group III-V nitride semiconductor can be formed is used instead of a sapphire substrate, the same effect can be obtained.

A description was given herein of an LED. However, in addition to an LED, a semiconductor laser device using a group III-V nitride semiconductor also provides the same effect.

As described above, the present invention achieves a low-operating-voltage semiconductor light-emitting device comprising a group III-V nitride semiconductor formed on a substrate having a different lattice constant from the group III-V nitride semiconductor. The semiconductor light-emitting device of the present invention is useful, in particular, as a semiconductor light-emitting device, such as a light-emitting diode and a semiconductor laser device, using a nitride semiconductor.

What is claimed is:

1. A semiconductor light-emitting device comprising:
    a substrate;
    a first conductivity type layer formed on the substrate and including a plurality of group III-V nitride semiconductor layers of a first conductivity type;
    an active layer formed on the first conductivity type layer; and
    a second conductivity type layer formed on the active layer and including a group III-V nitride semiconductor layer of a second conductivity type, wherein
    the first conductivity type layer includes:
        an intermediate layer made of Al$_x$Ga$_{1-x-y}$In$_y$N (wherein 0.001≦x<0.05, 0<y<1 and x+y<1),
        a first layer formed between the substrate and the intermediate layer, and
        a second layer formed between the intermediate layer and the active layer, and
    the first layer and the second layer contain impurities of the first conductivity type, and concentrations of the impurities are equal to each other.

2. The semiconductor light-emitting device of claim 1, wherein
    a part of the first conductivity type layer, the active layer and the second conductivity layer form a mesa, and
    the part of the first conductivity type layer forming part of the mesa is a part of the first conductivity type except at least the intermediate layer.

3. The semiconductor light-emitting device of claim 1, wherein the substrate is made of a hexagonal material, and the principal surface of the substrate is oriented along the (0001) plane.

4. The semiconductor light-emitting device of claim 1, wherein the substrate is made of sapphire.

5. The semiconductor light-emitting device of claim 1, wherein
    the intermediate layer contains impurities of the first conductivity type, and
    concentration of the impurities is equal to those in the first layer and the second layer.

6. The semiconductor light-emitting device of claim 1, wherein
    the first layer is in contact with the intermediate layer, and
    the intermediate layer is in contact with the second layer.

7. The semiconductor light-emitting device of claim 1, wherein
    the second layer has an exposed part, and
    an electrode of the first conductivity type is formed on the exposed part.

* * * * *